(12) United States Patent  
Yokobayashi et al.

(10) Patent No.: US 8,349,629 B2  
(45) Date of Patent: Jan. 8, 2013

(54) SEMICONDUCTOR LIGHT-EMITTING ELEMENT AND METHOD OF MANUFACTURING SAME

(75) Inventors: Yusuke Yokobayashi, Tokyo (JP); Satoshi Tanaka, Tokyo (JP); Masahiko Moteki, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 561 days.

(21) Appl. No.: 12/552,459

(22) Filed: Sep. 2, 2009

(65) Prior Publication Data

US 2010/0059781 A1  Mar. 11, 2010

(30) Foreign Application Priority Data

Sep. 8, 2008  (JP) ................................. 2008-229467

(51) Int. Cl.
  *G01R 31/26* (2006.01)
  *H01L 21/66* (2006.01)

(52) U.S. Cl. ................. 438/29; 438/22; 438/46; 438/47; 438/455; 438/778; 438/779; 438/780; 438/781; 438/782; 257/94; 257/96; 257/99; 257/102; 257/103; 257/E33.002; 257/E33.005; 257/E33.028; 257/E33.065; 257/E21.09; 257/E21.108; 257/E21.117

(58) Field of Classification Search .................. 257/94, 257/96–99, 102, 103, E33.002, E33.005, 257/E33.006, E33.013, E33.02, E33.028, 257/E33.03, E33.06, E33.065, E33.067, E21.09, 257/E21.097, E21.108, E21.117; 438/22, 438/29, 46, 47, 455, 778–782  
See application file for complete search history.

(56) References Cited

U.S. PATENT DOCUMENTS

| 2008/0128730 A1 | 6/2008 | Fellows et al. |
| 2009/0127575 A1* | 5/2009 | Horng et al. ................. 257/98 |
| 2010/0072500 A1 | 3/2010 | Herrmann |

FOREIGN PATENT DOCUMENTS

| JP | 2006-147787 A | 6/2006 |
| JP | 2007-214500 A | 8/2007 |
| JP | 2007-242645 A | 9/2007 |
| KR | 2007024238 A * | 3/2007 |
| WO | 2006/013698 A1 | 2/2006 |
| WO | 2008/060586 A2 | 5/2008 |
| WO | 2008/092774 A1 | 8/2008 |

OTHER PUBLICATIONS

English translation for KR2007024238A.*  
Japanese Office Action dated Oct. 9, 2012 (and English translation thereof) in counterpart Japanese Application No. 2008-229467.

* cited by examiner

*Primary Examiner* — Meiya Li  
(74) *Attorney, Agent, or Firm* — Holtz, Holtz, Goodman & Chick, PC

(57) ABSTRACT

A semiconductor light-emitting element includes a first semiconductor layer having a first conduction type, a second semiconductor layer having a second conduction type, an active layer provided between the first and second semiconductor layers, a polarity inversion layer provided on the second semiconductor layer, and a third semiconductor layer having the second conduction type provided on the polarity inversion layer. Crystal orientations of the first through third semiconductor layers are inverted, with the polarity inversion layer serving as a boundary. The first and third semiconductor layers have uppermost surfaces made from polar faces having common constitutional elements. Hexagonal conical protrusions arising from a crystal structure are formed at outermost surfaces of the first and third semiconductor layers. The first through third semiconductor layers are made from a wurtzite-structure group III nitride semiconductor, and are layered along a C-axis direction of the crystal structure.

6 Claims, 11 Drawing Sheets

SEMICONDUCTOR LIGHT-EMITTING ELEMENT AND METHOD OF MANUFACTURING SAME

CROSS-REFERENCE TO RELATED APPLICATIONS

This application is based on Japanese Patent Application No. 2008-229467, filed Sep. 8, 2008, the entire contents of which are incorporated herein by reference.

BACKGROUND OF THE INVENTION

1. Field of the Invention

The present invention relates to a semiconductor light-emitting element and to a method of manufacturing a semiconductor light-emitting element, and in particular relates to technology to improve the efficiency of light extraction of a light-emitting diode (LED).

2. Description of the Related Art

Light-emitting diodes (hereafter abbreviated "LEDs") are mainly used in the taillights of automobiles, in various display devices, and in the backlights of portable telephones and other mobile equipment. There is anticipated a considerable expansion of demand for its use in the headlights of automobiles, the backlights of liquid crystal displays, and in general lighting fixtures. The light emission efficiency of current LEDs is approximately 50 lm/W. For use in backlights, lighting fixtures and similar, a light emission efficiency of 100 lm/W or higher is necessary. The light emission efficiency of an LED is determined by the product of the internal quantum efficiency when emitting light in the light emission layer and the light extract efficiency for extracting light to the outside The internal quantum efficiency has by now been improved to 80% or higher, but there remains room for improvement of the light extraction efficiency.

One known technology for improving the light extraction efficiency is the provision of roughness in the light emission face of the semiconductor light-emitting element. By making roughness modification in the light emission face, light which is incident at the critical angle or greater at the interface between the semiconductor light-emitting element and the sealing resin and which undergoes total reflection can be reduced. This improves the light extraction efficiency.

This rough shape can be formed by performing appropriate treatment on each light emission face of the semiconductor light-emitting element (p layer surface, growth substrate surface/rear face, and n layer surface after growth substrate separation). For example, Japanese Patent Application Kokai (Laid-open) No. 2006-147787 discloses a semiconductor light-emitting element that has, in order on a sapphire substrate, a low-temperature buffer layer, a first cladding layer, active layer, and second cladding layer. By using the second cladding layer in which growth pits have occurred naturally as a light extraction face, the light extraction efficiency is improved. Alternatively, by performing wet etching or dry etching on the first cladding layer exposed upon separating of the sapphire substrate, bits are formed and therefore the light extraction efficiency is improved.

SUMMARY OF THE INVENTION

In order to achieve the highest light extraction efficiency in a semiconductor light-emitting element, the growth substrate may be cut away to leave only the semiconductor growth layers, and roughness may be formed on both the surfaces of the n layer and the p layer. This is because if the growth substrate is left in place, the total reflection or light occurring at the interface between the semiconductor growth layer and the growth substrate may reduce the light extraction efficiency, and the light absorption occurring when light passes through the growth substrate interior may also reduce the light extraction efficiency.

In growth of $Al_xIn_yGa_zN$ ($0 \leq x \leq 1$, $0 \leq y \leq 1$, $0 \leq z \leq 1$, $x+y+z=1$), which is a material used in blue LEDs, on general growth substrates (for example, C-plane sapphire, C-plane GaN, and SiC), the growth substrate is separated and the exposed n layer (n-type GaN layer) surface will have a C− face (N face). By wet etching a roughness, arising from a wurtzite crystal structure, can be formed in the n layer surface. On the other hand, the p layer having the chemically stable C+ face (Ga face) exposed on the uppermost face (p-type GaN layer) is not readily susceptible to roughness formation by wet etching.

When a dry etching method employing plasma such as RIE is used, the p layer (p-type GaN layer) is damaged and becomes highly resistive, so that the light emission efficiency is dramatically reduced. When a rough face is formed by means of growth pits which take penetrating dislocations as starting points, as disclosed in Japanese Patent Application Laid-open No. 2006-147787, the leakage current caused by penetrating dislocations increases, and the internal quantum efficiency declines. That is, if growth pits are formed densely in the surface of a semiconductor light-emitting element in order to improve the light extraction efficiency, the leakage current increases correspondingly, and the internal quantum efficiency declines. Consequently the light emission efficiency is not improved. Also, there are concerns that the number of elements which do not emit light may increase, so that the problem of worsened production yields occurs. In this way, modification (processing) of the p layer surface which exposes the C+ face (Ga face) is difficult, and methods to form roughness are limited. It is therefore difficult to form roughness on both the surfaces of the n layer and p layer while maintaining light emission performance.

On the other hand, as described above, when the growth substrate is separated (removed) in order to improve the light extraction efficiency, the thickness of the remaining semiconductor growth layers becomes approximately 2 to 15 μm. Hence it is difficult to transport, mount, or process a wafer after separation of the growth substrate in a vacuum evaporation deposition system to form electrode pads, or in a scribing/breaking device for separation into chips. After separation of the growth substrate, the wafer becomes thin and has reduced mechanical strength, so that handling properties are greatly worsened. If a method such as that described in Japanese Patent Application Laid-open No. 2006-147787 is used, the roughness is provided on one face of the light-emitting element, the light-emitting element is fixed on a sub-mount, the growth substrate is separated, and roughness is formed on the other face which is exposed as a result of growth substrate separation. This method is useful, but entails an increase in the number of processes. Also, when wet etching is used for roughness formation, treatment to protect electrodes and other members formed in advance from the etchant are necessary, so that treatment becomes troublesome.

In the semiconductor light-emitting device described in Japanese Patent Application Laid-open No. 2006-147787, roughness modification of both faces of the light-emitting element is performed with the object of improving the light extraction efficiency. In the case of a light-emitting device which extracts light from only one side, a light-reflecting member is necessary. However, even if a light-reflecting member is provided, not all the light is reflected, and a portion of the light is absorbed. Also, light reflected by the light-reflecting member may be partially absorbed by the active layer and is converted into heat energy. In a light-emitting device having such a light-reflecting member to extract light from one face, losses in the light extraction efficiency occur, and the advantageous result of forming roughness on both faces of the light-emitting element is limited.

One object of the present invention is to provide a semiconductor light-emitting element, which can improve the light extraction efficiency and the handling properties in manufacturing processes after separation of the growth substrate.

Another object of the present invention is to provide a method of manufacturing a semiconductor light-emitting element, which can improve the light extraction efficiency and the handling properties in manufacturing processes after separation of the growth substrate.

Still another object of the present invention is to provide a semiconductor light-emitting device that can advantageously include a semiconductor light-emitting element having roughness on both faces thereof. The light extraction efficiency of the light-emitting element has been improved by forming the roughness.

According to one aspect of the present invention, there is provided a semiconductor light-emitting element that includes a first semiconductor layer having a first conduction type and a second semiconductor layer having a second conduction type. The semiconductor light-emitting element also includes an active layer provided between the first semiconductor layer and the second semiconductor layer. The semiconductor light-emitting element also includes a polarity inversion layer provided on the second semiconductor layer. The semiconductor light-emitting element also includes a third semiconductor layer provided on the polarity inversion layer. The third semiconductor layer has the second conduction type. Crystal orientations of the first through third semiconductor layers are inverted, with the polarity inversion layer serving as a boundary. Outermost surfaces of the first and third semiconductor layers are polar faces. The polar faces are made from common constituent elements. Hexagonal conical protrusions arising from a crystal structure are formed at the outermost surfaces of the first and third semiconductor layers.

The first through third semiconductor layers may include a wurtzite-structure group III nitride semiconductor, and may be layered along the C-axis direction of the crystal structure. The common constituent elements of the polar faces may be nitrogen atoms. The hexagonal conical protrusions may be formed by wet etching.

According to another aspect of the present invention, there is provided a semiconductor light-emitting device that includes a transparent substrate and a semiconductor light-emitting element mounted on the transparent substrate. The semiconductor light-emitting device also includes a lead terminal electrically connected to the semiconductor light-emitting element. The semiconductor light-emitting device also includes spherical transparent sealing resin which buries the semiconductor light-emitting element and the transparent substrate. The semiconductor light-emitting element is, for example, one that is described in the first aspect of the present invention.

According to still another aspect of the present invention, there is provided a unique semiconductor light-emitting element manufacturing method. The resulting semiconductor light-emitting element includes a first semiconductor layer having a first conduction type and a second semiconductor layer having a second conduction type. The semiconductor light-emitting element also includes an active layer provided between the first semiconductor layer and the second semiconductor layer. The semiconductor light-emitting element also includes a polarity inversion layer provided on the second semiconductor layer and a third semiconductor layer provided on the polarity inversion layer. The third semiconductor layer has the second conduction type. The method of manufacturing the semiconductor light-emitting element includes a step of preparing a growth substrate. The manufacturing method also includes a step of forming a layered structure, by layering in order on the growth substrate a first semiconductor layer, an active layer, a second semiconductor layer, a polarity inversion layer, and a third semiconductor layer. The manufacturing method also includes a step of separating the growth substrate from the layered structure to expose the first semiconductor layer. The manufacturing method also includes a step of wet etching the layered structure to form hexagonal conical protrusions arising from the crystal structure, on the outermost surface of the first semiconductor layer and the surface of the third semiconductor layer. The manufacturing method also includes a step of forming a transparent support member on at least one of the upper and lower faces of the layered structure.

These and other objects, aspects and advantages of the present invention will become clear to those skilled in the art from the following detailed description when the detailed description is read and understood in conjunction with the appended claims and drawings.

DETAILED DESCRIPTION OF THE INVENTION

Figure 1:
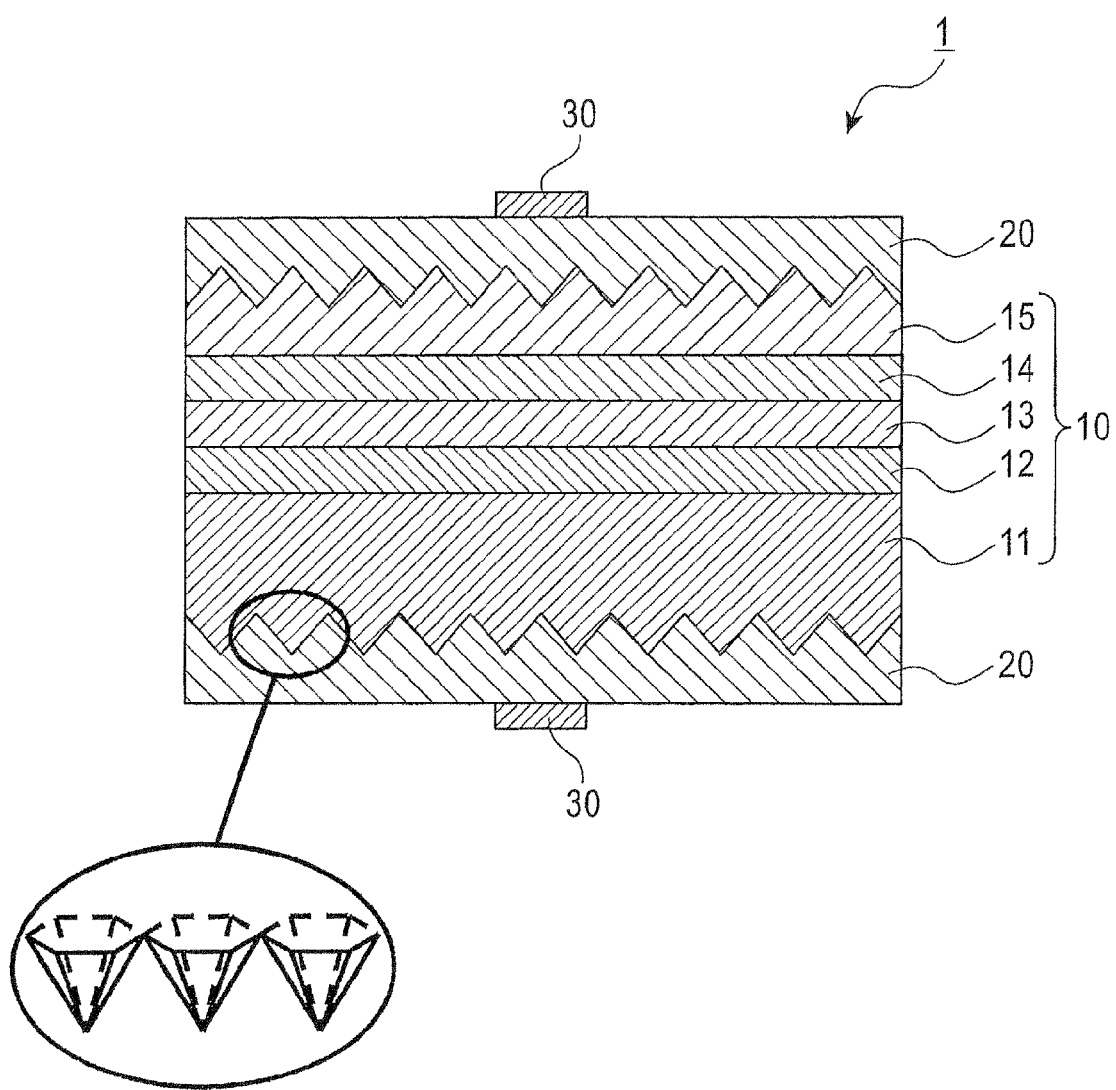
FIG. 1 is a cross-sectional view showing the configuration of the semiconductor light-emitting element according to a first embodiment of the invention.

Below, embodiments of the invention are explained referring to the drawings. In the following drawings, constituent elements and portions which are effectively the same or equivalent are assigned the same or similar reference symbols or numerals even if they are shown in different drawings.
First Embodiment Referring to FIG. 1, the configuration of the semiconductor light-emitting element 1 of a first embodiment of the invention will be described. The semiconductor light-emitting element 1 includes an epitaxial layer 10, transparent conductive layers 20 formed on both surfaces of the epitaxial layer 10, and electrode pads 30 formed on the (outermost) surfaces of the transparent conductive layers 20. A plurality of hexagonal conical protrusions, arising from the crystal structure of the epitaxial layer 10, are formed over substantially the entire faces of both surfaces of the epitaxial layer 10 by wet etching with an alkali solution. Below, each of the constituent portions of the light-emitting element 1 is explained in detail.

The epitaxial layer 10 has a layered structure in which are layered in order on the growth substrate an n-type semiconductor layer 11, active layer 12, first p-type semiconductor layer 13, polarity inversion layer 14, and second p-type semiconductor layer 15. Except for the polarity inversion layer 14, the epitaxial layer 10 is made from $Al_xIn_yGa_zN$ ($0 \leq x \leq 1$, $0 \leq y \leq 1$, $0 \leq z \leq 1$, $x+y+z=1$). The n-type semiconductor layer 11 has, for example, an n-type GaN layer doped with Si. The active layer 12 has a multiple quantum well structure made from InGaN/GaN. The first p-type semiconductor layer 13 and second p-type semiconductor layer 15 have, for example, p-type GaN layers doped with Mg. The polarity inversion layer 14 may be formed by depositing a GaN layer, doped with Mg to a high concentration (for example $1 \times 10^{20}$ cm$^{-3}$ or higher), to a thickness of 2 nm. It should be noted that the polarity inversion layer 14 may be a single Mg layer having a thickness of approximately 1 nm. The second p-type semiconductor layer (p-type GaN layer) 15 formed on the polarity inversion layer 14 grows along the C− direction, with a C− face (N face) exposed on the outermost surface.

Figure 2:
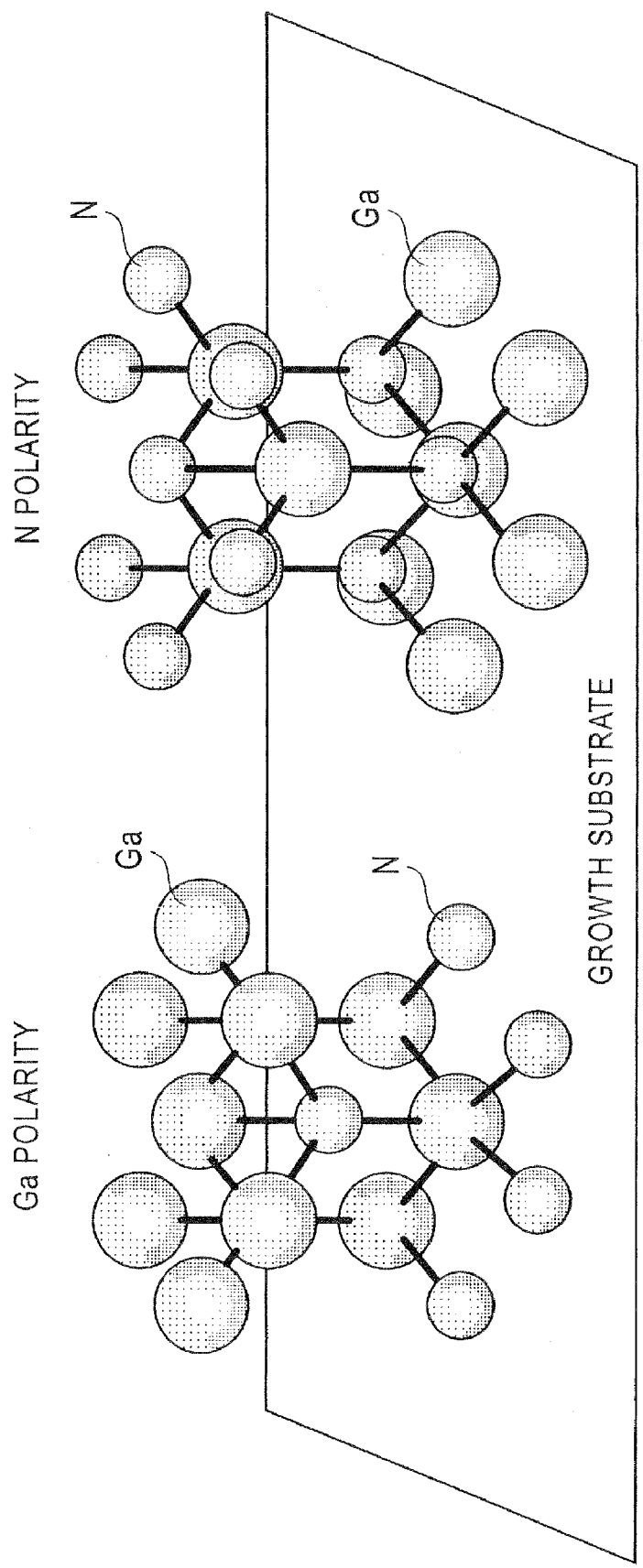
FIG. 2 schematically illustrates two polarities in a GaN crystal structure.

Here, in order to fabricate a group III nitride semiconductor device, normally (the C face of) a sapphire substrate, which is a hexagonal crystal, is used. The group III nitride semiconductor crystal, having the wurtzite crystal structure, grows on the sapphire substrate with the C axis aligned with that of the sapphire substrate. In this wurtzite structure, there is no symmetry in the C axis direction (i.e., in the growth direction) so that taking GaN as an example, there arises the possibility of growth of GaN films having two crystallographically distinct epitaxial relations. Specifically, as shown in FIG. 2, there are a GaN film having a Ga face (C+ face) as the outermost surface, and a GaN film having an N face (C− face) as the outermost surface. The polarity of the former GaN film is called the Ga polarity (group III polarity), and the polarity of the latter GaN film is called the N polarity (group V polarity).

Because the GaN film having Ga polarity is superior with respect to electrical and optical characteristics, the first p-type semiconductor layer 13, which influences light emission characteristics, has a GaN layer with Ga polarity. Ga polarity can be obtained by first performing thermal cleaning of the growth substrate, and then forming a low-temperature buffer layer on the growth substrate or performing other preliminary treatment On the other hand, a GaN layer with Ga polarity is chemically stable, as explained above, so that roughness cannot be formed by wet etching. Hence in this embodiment, by interposing the polarity inversion layer 14 between the first p-type semiconductor layer 13 and the second p-type semiconductor layer 15, the crystal orientation of the epitaxial layer 10 is inverted with the polarity inversion layer 14 as a boundary. Then, by causing a C− face (N face) to be exposed at the outermost surface of the second p-type semiconductor layer 15, roughness formation by wet etching is made possible. In this way, the polarity inversion layer 14 serves to convert growth of a GaN layer having Ga polarity (group III polarity) into growth of a GaN layer having N polarity (group V polarity). Over the entire surface of the second p-type semiconductor layer 15, with a C− face (N face) exposed at the outermost surface, hexagonal conical protrusions arising from the wurtzite (hexagonal) crystal structure is formed by wet etching treatment using an alkali solution.

On the other hand, the outermost surface of the n-type semiconductor layer 11, comprising an n-type GaN layer which is exposed by separating the growth substrate, is a C− face (N face), and roughness formation by wet etching treatment is possible. Similar to the second p-type semiconductor layer 15, hexagonal conical protrusions, arising from the wurtzite (hexagonal) crystal structure, are provided over the entire surface of the n-type semiconductor layer 11, formed by wet etching treatment using an alkali solution. In this way, polar faces with C− faces (N faces) exposed at the outermost surfaces are formed at both surfaces of the epitaxial layer 10, and roughness can easily be formed on these faces, which become light-emitting faces, through batch wet etching treatment. Because the size (height) of the hexagonal conical protrusions is approximately 0.5 to 5 μm, it is preferable that the thickness of the n-type semiconductor layer 11 be 6 μm or greater, and still more preferably 10 μm or greater. This is because if the thickness of the n-type semiconductor layer 11 is less than 6 μm, there is a concern that wet etching treatment to form hexagonal conical protrusions may cause a portion of the active layer 12 to be exposed, or that leakage currents due to penetrating dislocations may occur, so that the light emission efficiency may drop. Also, by securing a certain thickness for the n-type semiconductor layer 11, the current flowing in the n-type semiconductor layer 11 can be dispersed in lateral directions, so that uniform current injection over the entirety of the active layer 12 becomes possible. As a result, the occurrence of non-emitting regions can be prevented, and light emission efficiency can be improved. Further, the electrostatic breakdown voltage is increased, which improves reliability.

Transparent conductive layers 20 are formed on the outermost surfaces of the n-type semiconductor layer 11 and the second p-type semiconductor layer 15, on which hexagonal conical protrusions are formed. The transparent conductive layers 20 can for example be made from ITO paste. The ITO paste includes ITO particles that are dispersed in a resin binder. In this embodiment, the transparent conductive layers 20 serve to inject current into the epitaxial layer 10, and also serve as transparent support members which secure mechanical strength for the wafer after separation (removal) of the growth substrate. Hence it is preferable that the total thickness of the epitaxial layer 10 and of the transparent conductive layers 20 formed on the upper and lower faces of the epitaxial layer be 20 μm or greater. This is because if the total thickness is less than 20 μm, mechanical strength is not secured. As a result, wafer cracking, chipping and similar may occur when transporting the wafer, mounting the wafer in equipment, and performing treatment in the subsequent processes (e.g., electrode formation process and scribing/ breaking process). This would considerably reduce production yields. The transparent conductive layers 20 can employ, instead of the ITO paste, ITO ink (fine ITO particles dispersed in an alcohol solvent), a charge-transfer resin such as polycarbonate resin with a hydrazone compound, carbazole compound, oxadiazole compound, or other electron-donor type compound material dispersed, polyvinyl carbazole (PVK), polyethylene dioxythiophene (PEDOT), or another conductive polymer, so long as the material possesses electrical conductivity and transparency at the emission wavelength.

On each of the transparent conductive layers 20 provided on the n-layer side and on the p-layer side are provided electrode pads 30. The electrode pads 30 are formed by depositing Au or similar onto the transparent electrodes using for example evaporation deposition or sputtering, and performing patterning.

Thus in manufacturing the semiconductor light-emitting element 1 of this embodiment, the separation of the growth substrate eliminates light extraction losses arising from reflection and similar at the interface between the growth substrate and the epitaxial layer. Moreover, roughness derived from hexagonal conical protrusions is provided on both the outermost faces on the n-layer side and p-layer side, which become light-emitting faces, so that compared with a case in which the light-emitting faces are flat, light which undergoes total reflection at the interface and is not emitted to the outside can be reduced. Accordingly, the light extraction efficiency can be further improved. By introducing a polarity inversion layer, C− faces (N faces) are exposed on both upper and lower surfaces of the epitaxial layer 10, so that wet etching can be used to form roughness on both upper and lower surfaces of the epitaxial layer 10. Therefore, light extraction efficiency can be improved, without an accompanying decline in the internal quantum efficiency. Further, the reduced mechanical strength due to separation of the growth substrate is augmented by the transparent conductive layers, so that handling properties are improved in the subsequent electrode formation process and scribing/breaking process. This contributes to improved production yields.

Next, a method of manufacturing a semiconductor light-emitting element 1 with the structure described above is explained, referring to FIGS. 3A to 3C through FIGS. 4D to 4G. FIG. 3A through FIG. 3C and FIG. 4D through FIG. 4G are a series of cross-sectional views of manufacturing processes for the semiconductor light-emitting element 1.

Semiconductor Layer Growth Process

In this embodiment, a C face sapphire substrate 90, on which the MOCVD method (metalorganic chemical vapor deposition method) can be used to form an epitaxial layer 10 having $Al_xIn_yGa_zN$ ($0 \leq x \leq 1$, $0 \leq y \leq 1$, $0 \leq z \leq 1$, $x+y+z=1$), is employed. The layers that constitute the epitaxial layer 10 are layered on the sapphire substrate 90, along the C-axis direction of the wurtzite crystal structure, using the MOCVD method.

First, the sapphire substrate 90 is prepared, and thermal cleaning of the sapphire substrate 90 is performed. Specifically, the sapphire substrate 90 is transported into an MOCVD device, and heating is performed for approximately 10 minutes at approximately 1000° C. in a hydrogen atmosphere. Next, the atmospheric temperature is lowered to 500° C., and TMG (trimethyl gallium) (flow rate 10.4 μmol/min) and $NH_3$ (flow rate 3.3 LM) are supplied for approximately 3 minutes to form a low-temperature buffer layer (not shown) having a GaN layer. Then, the atmospheric temperature is raised to 1000° C., and this temperature is held for approximately 30 seconds so that the low-temperature buffer layer is crystallized. By means of this preliminary treatment, a semiconductor growth layer with Ga polarity (group III polarity), having excellent electrical and optical characteristics, is formed on the sapphire substrate 90. Next, with the atmospheric temperature held at 1000° C., TMG (flow rate 45 μmol/min) and $NH_3$ (flow rate 4.4 LM) are supplied for approximately 20 minutes, to form a base GaN layer (not shown) of thickness approximately 1 μm. Next, with the atmospheric temperature at 1000° C., TMG (flow rate 45 μmol/min), $NH_3$ (flow rate 4.4 LM), and $SiH_4$ (flow rate $2.7 \times 10^{-9}$ mol/min) as a dopant gas are supplied for approximately 200 minutes, toから the n-type semiconductor layer 11 having an n-type GaN layer, of thickness approximately 10 μm. As explained above, it is important that a certain film thickness be secured for the n-type semiconductor layer 11, in order that the active layer 12 not be exposed in the subsequent wet etching treatment, and in order that current dispersion in lateral directions within the n-type semiconductor layer 11 be promoted.

Next, the active layer 12 is formed on the n-type semiconductor layer 11. In this embodiment, a multiple quantum well structure having InGaN/GaN is adopted for the active layer 12. That is, growth is performed for five periods, with InGaN/GaN as one period. Specifically, with the atmospheric temperature at 700° C., TMG (flow rate 3.6 μmol/min), TMI (trimethyl indium) (flow rate 10 μmol/min), and $NH_3$ (flow rate 4.4 LM) are supplied for approximately 33 seconds, to form an InGaN well layer of thickness approximately 2.2 nm. Then, TMG (flow rate 3.6 μmol/min) and $NH_3$ (flow rate 4.4 LM) are supplied for approximately 320 seconds, to form a GaN barrier layer of thickness approximately 15 nm. This processing is repeated for five periods to form the active layer 12.

Next, the atmospheric temperature is raised to 870° C., and TMG (flow rate 8.1 μmol/min), TMA (trimethyl aluminum) (flow rate 7.5 μmol/min), $NH_3$ (flow rate 4.4 LM), and, as a dopant, CP2Mg (bis-cyclopentadienyl Mg) (flow rate $2.9 \times 10^{-7}$ μmol/min) are supplied for approximately 5 minutes, to form a p-type AlGaN cladding layer (not shown) of thickness approximately 40 nm. Next, with the atmospheric temperature unchanged, TMG (flow rate 18 μmol/min), $NH_3$ (flow rate 4.4 LM), and, as a dopant, CP2Mg (flow rate $2.9 \times 10^{-7}$ μmol/min) are supplied for approximately 7 minutes, to form the first p-type semiconductor layer 13, having a p-type GaN layer of thickness approximately 150 nm.

The semiconductor growth layers formed on the sapphire substrate 90 through the above processing are all formed by means of C+ growth, and have Ga polarity, with a group III element (Ga) arranged in the outermost surface.

Next, TMG (flow rate 18 μmol/min) $NH_3$ (flow rate 5 LM), and CP2Mg (flow rate $2.9 \times 10^{-7}$ μmol/min) are supplied for approximately 10 seconds, to form the polarity inversion layer 14, of thickness approximately 2 nm. In this way, by forming a polarity inversion layer, having a GaN layer doped with Mg at a high concentration, on a C+ grown growth film having G polarity (group III polarity), the semiconductor growth layer formed on this layer becomes C− grown, with N atoms (a group V element) arranged in the outermost surface.

Next, TMG (flow rate 18 μmol/min), $NH_3$ (flow rate 4.4 LM), and, as a dopant, CP2Mg (flow rate $2.9 \times 10^{-7}$ μmol/min) are supplied for approximately 90 minutes, to form the second p-type semiconductor layer 15, having an n-type GaN layer of thickness approximately 1.5 μm. The second p-type semiconductor layer 15 formed on the polarity inversion layer 14 has N polarity (group V polarity), with N atoms (a group V element) arranged in the outermost surface.

Growth Substrate Separation Process

Figure 3A:
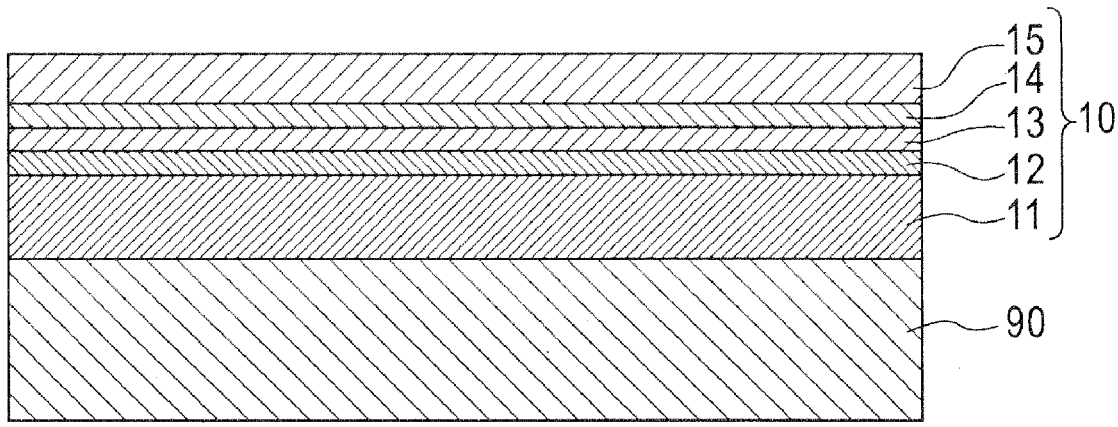
FIGS. 3A, 3B, 3C and FIG. 4D, 4E, 4F are a series of cross-sectional views showing a process of manufacturing the semiconductor light-emitting element shown in FIG. 1.
Figure 3B:
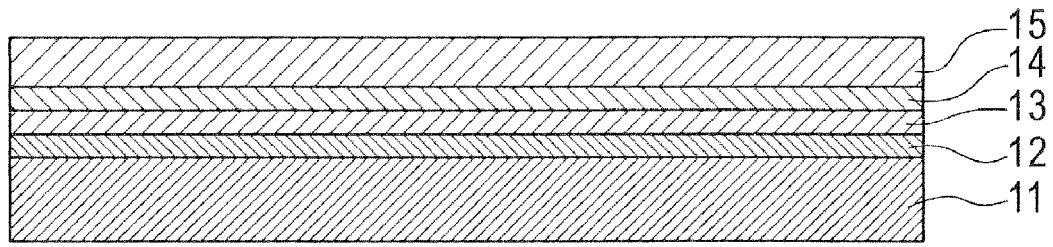

After completion of the semiconductor layer growth process, the sapphire substrate 90 is separated from the epitaxial layer 10. To separate the sapphire substrate 90, a known method such as the LLO (laser liftoff) method or similar can be used. In the LLO method, irradiated laser light causes decomposition into metallic Ga and $N_2$ gas of the GaN layer formed on the sapphire substrate 90. Hence this decomposition occurs within the n-type semiconductor layer 11 or base GaN layer. After the sapphire substrate 90 has been separated, the n-type semiconductor layer 11 or base GaN layer is exposed. In either case, after separation of the sapphire substrate, the exposed outermost surface is a C– face (N face). That is, at this time, the upper face and lower face of the semiconductor light-emitting element 1 have a C– face (N face) exposed. It should be noted that separation of the sapphire substrate 90 may be carried out by grinding, polishing, dry etching or other methods, other than the LLO method. Also, when an SiC substrate or other substrate which can be wet etched is used as the growth substrate, the growth substrate may be eliminated by wet etching. In any case, the outermost surfaces of the epitaxial layer 10 exposed after growth substrate separation are C– faces (N faces) (FIG. 3B).

Wet Etching Process

Figure 3C:
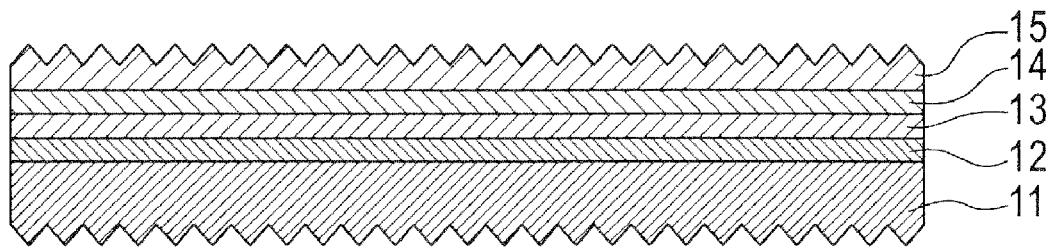

The sapphire substrate 90 is separated, and the wafer, which has only the semiconductor growth layer, is immersed in a KOH solution at 50 to 90° C. for 5 to 120 minutes. By means of this wet etching, a plurality of hexagonal conical protrusions are formed over the entire outermost surfaces of the n-type semiconductor layer 11 and the second p-type semiconductor layer 15, at which C– faces (N faces) are exposed in the outermost surfaces. These hexagonal conical protrusions have shapes which arise from the crystal structure of $Al_xIn_yGa_zN$, having a wurtzite (hexagonal) crystal structure. Through wet etching using a KOH solution, the hexagonal conical protrusions can be obtained easily with good reproducibility, without using a mask or similar. While depending on the $Al_xIn_yGa_zN$ composition and growth conditions, the wet etching under the above-described conditions can form hexagonal conical protrusions, of width approximately 1 µm and with angle made by the base plane and side face of approximately 60°, substantially uniformly over the entire outermost surfaces of the n-type semiconductor layer 11 and the p-type semiconductor layer 15. In wet etching, only the C– face (N face) is etched; the C+ face (Ga face) is not etched. Accordingly, the first p-type semiconductor layer 13, provided below the second p-type semiconductor layer 15, acts as a layer to halt etching. Hence even when the p-layer side is excessively etched, no problems related to function tend to occur. On the other hand, if the n-type semiconductor layer 11 is excessively etched, the active layer 12 is reached, and an increase in the leakage current may result. From the standpoint of preventing increases in the leakage current due to excessive etching, the n-type semiconductor layer 11 must have a certain thickness, and it is preferable that the thickness be 6 µm or greater, and more preferably 10 µm or greater. When etching is completed, the wafer is removed from the KOH solution, cleaned, and dried (FIG. 3C).

Semiconductor Layer Support Process

Figure 4D:
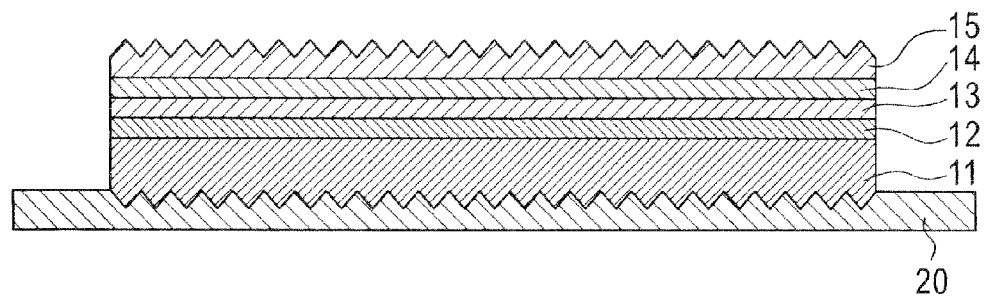

An ITO paste that will be used later to form the transparent conductive layers 20 upon thermal hardening is prepared in a container. The wafer, having been subjected to the above-described processing, is placed thereupon (FIG. 4D). Then, the ITO paste is applied to the wafer from above so as to bury the wafer, and thermal hardening is performed for 60 minutes at approximately 130° C. In this way, the sapphire substrate 90 is separated, and transparent conductive layers 20 having adequate thickness are provided on the upper and lower faces of the wafer, the mechanical strength of which has been reduced, to form electrodes and to enhance the mechanical strength of the wafer. Thus, handling properties are improved in the subsequent electrode pad formation process and scribing/breaking process, and wafer cracking, chipping, and similar can be prevented. From the standpoint of securing mechanical strength for the wafer, it is preferable that the thickness of the transparent conductive layers 20 be set such that the total of the thicknesses of the epitaxial layer 10 and the transparent conductive layers 20 is 20 µm or greater.

Alternatively, the wafer may be placed on the ITO paste and then thermal hardening may be carried out. Subsequently, another ITO paste may be applied onto the wafer, and this ITO paste may be hardened. Alternatively, thermal-hardened ITO paste may be prepared first, and then another soft ITO paste is applied thereon. Then, the wafer may be placed on the soft ITO paste and thermal hardening is carried out. Subsequently, soft ITO paste may be applied over the wafer, and this may be thermal-hardened. Although these approaches require two thermal hardening processes, one of the transparent conductive layers 20 is hardened prior to the other, so that handling properties in this process are improved.

Electrode Pad Formation Process

Figure 4E:
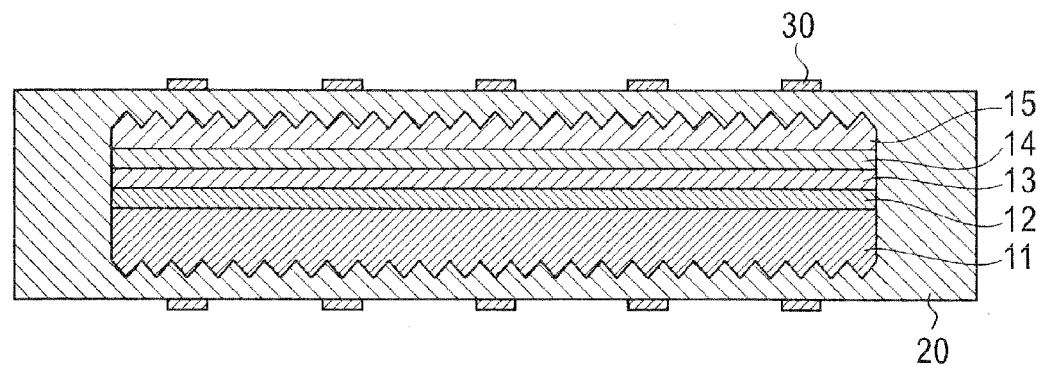

Resist masks are formed having an opening in the portion corresponding to the region of electrode pad formation on the transparent conductive layers 20 on the p-layer side and on the n-layer side. Then, Au, Ti/Al, or another suitable metal is vacuum deposited onto the transparent conductive layers 20 with the resist masks. The resist masks are removed, and electrode pads 30 are formed on the transparent conductive layers 20 on the p-layer side and on the n-layer side. Because the transparent conductive layers 20 are formed in the preceding semiconductor layer support process, mechanical strength of the wafer is secured, and therefore wafer handling properties in this process are improved. It should be noted that the electrode pads 30 may be formed by using screen printing to apply an Ag paste or cream solder to the region of the electrode pad formation (FIG. 4E).

Chip Separation Process

Figure 4F:
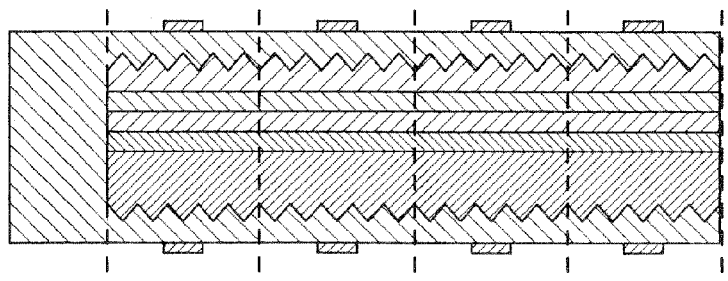
Figure 4G:
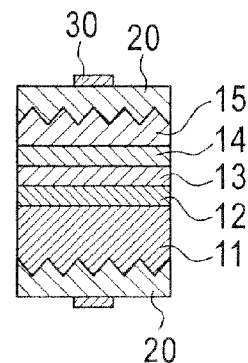
FIG. 4G illustrates a cross-sectional view of one semiconductor light-emitting element obtained upon chip individualization (e.g., dicing)

In order to separate the wafer into chips, a specialized scribing device equipped with a diamond scribing tool is used. The wafer is mounted on the scribing device, and the wafer is separated into chips by marking the wafer along scribe lines. It should be noted that a pulse laser may be used, or dicing may be performed to separate the wafer into chips. Similar to the above-described electrode pad formation process, mechanical strength of the wafer is already secured in the previous semiconductor layer support process, and therefore wafer handling properties in this process are improved (FIG. 4F). After the above processes, the semiconductor light-emitting element 1 (FIG. 4G) of this embodiment is completed.

By means of the method of manufacturing according to this embodiment, a C– face (N face) is exposed at both the outermost surfaces of the n layer and the p layer of the semiconductor light-emitting element through introduction of a polarity inversion layer. By performing batch treatment of the surfaces of these layers using wet etching with an alkali solution, hexagonal conical protrusions having the crystal structure can be formed. In this way, roughness can be formed on both faces of the semiconductor light-emitting element by wet etching treatment, so that compared with methods of forming growth pits utilizing penetrating dislocations or methods of forming roughness by dry etching methods, high light extraction efficiency can be realized without being accompanied by a decline in the internal quantum efficiency.

After separation of the growth substrate, the semiconductor light-emitting element includes only the semiconductor growth layer, and mechanical strength is reduced; but transparent conductive layers having sufficient thickness function as support members supporting the semiconductor growth layer, and mechanical strength is secured. Thus, wafer handling is facilitated in the subsequent electrode pad formation and scribing/breaking processes, and the occurrence of wafer cracking and chipping can be prevented.

Second Embodiment

Figure 5:
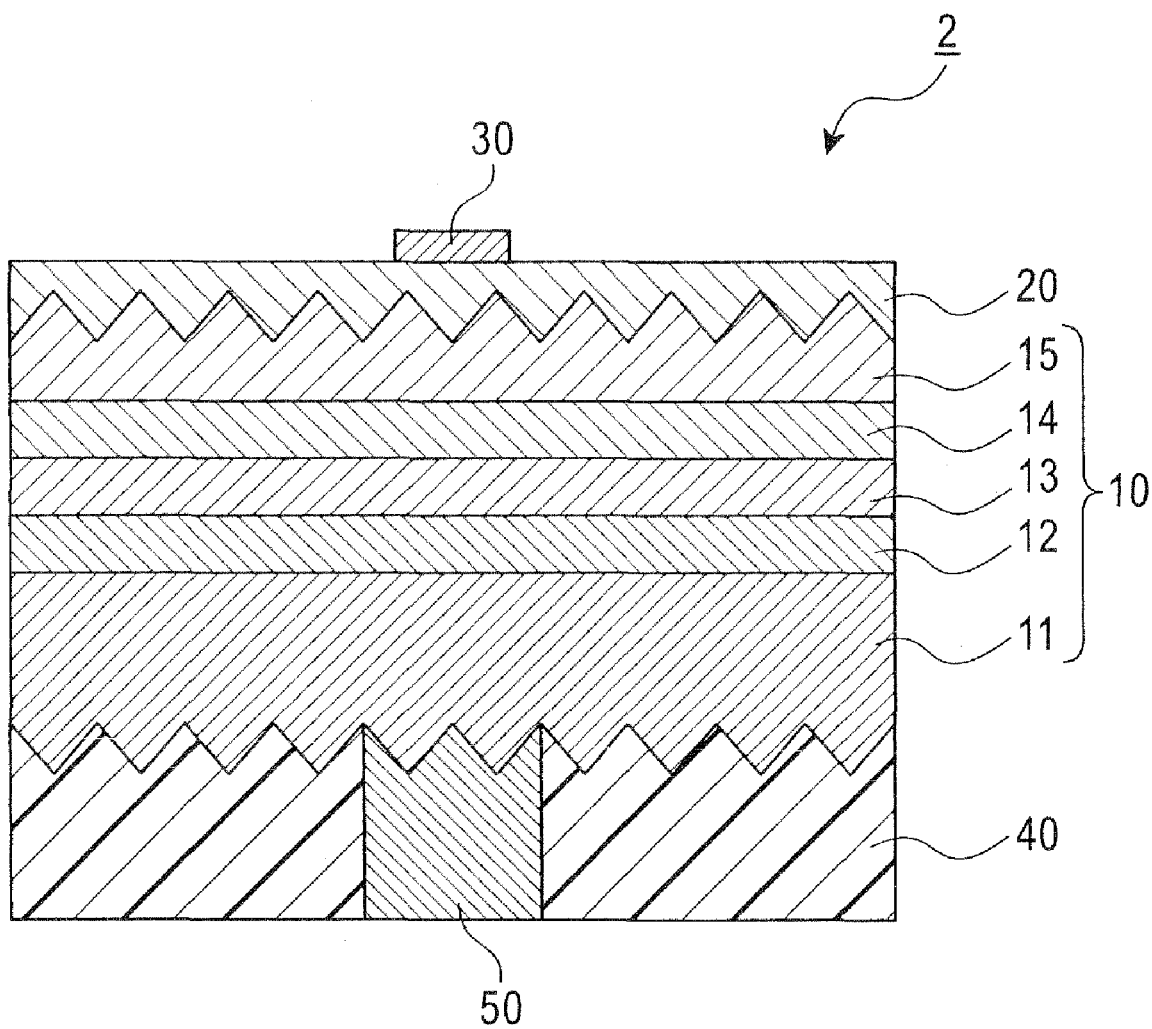
FIG. 5 is a cross-sectional view of another semiconductor light-emitting element according to a second embodiment of the invention.

FIG. 5 is a cross-sectional view of the semiconductor light-emitting element 2 of a second embodiment of the invention. The semiconductor light-emitting element 2 has a structure similar to that of the semiconductor light-emitting device 1 of the first embodiment, with respect to the epitaxial layer 10, the transparent conductive layer 20 formed on the second p-type semiconductor layer 15, and the electrode pads 30. The semiconductor light-emitting device 2 of the second embodiment has a configuration differing from that of the first embodiment in that a transparent support member 40 having transparency and insulating properties is provided on the n-type semiconductor layer 11, and an electrode 50 is provided penetrating the transparent support member 40 and reaching the surface of the n-type semiconductor layer 11. Below, those portions that differ from the first embodiment are explained in detail.

The transparent support member 40 is for example made from an epoxy resin having transparency at the emission wavelength. The transparent support member 40 serves mainly to support the epitaxial layer 10, the mechanical strength of which has been reduced due to separation of the growth substrate. Hence it is preferable that the thickness of the transparent support member 40 be 20 μm or greater, in order to secure mechanical strength for the semiconductor light-emitting element 2. By providing the transparent support member 40 with a thickness of 20 μm or greater, the semiconductor light-emitting element 2 can possess adequate mechanical strength, and it is therefore sufficient that the transparent conductive layers 20 exhibit only a current injection function. As a result, the thickness of the layers 20 can be reduced compared with the semiconductor light-emitting element 1 of the first embodiment (to for example approximately 1 μm), and the light extraction efficiency can be improved. Because ITO particles dispersed in a resin binder is used in the transparent conductive layers 20, the transparent conductive layers 20 have lower optical transmissivity compared with a transparent support member 40 made from epoxy resin. Hence in this embodiment, the thickness of the transparent support member 40 with high optical transmissivity is used to secure mechanical strength, and the thickness of the transparent conductive layers 20 with low optical transmissivity is reduced, to improve light extraction efficiency.

As explained above, the n-type semiconductor layer 11 is formed to a certain thickness, and current passing within the n-type semiconductor layer 11 can disperse in lateral directions, so that there is no need to provide a transparent conductive layer in contact with the entire face of the n-type semiconductor layer 11. On the other hand, the second p-type semiconductor layer 15 is thin compared with the n-type semiconductor layer 11, and has poor crystallinity. Thus, a transparent conductive layer 20 is provided in contact with the second p-type semiconductor layer 15 such that current is dispersed by the transparent conductive layer 20 in this embodiment.

It should be noted that the transparent support member 40 need only be of a material having mechanical strength be transparent at the emission wavelength and be modifiable (processible). Thus, a silicone resin, low-melting point glass, polycarbonate resin, or other transparent resin materials can be used instead of the epoxy resin. It should also be noted that by dispersing YAG or another phosphor within the transparent support member 40, a white light light-emitting element can be obtained.

The electrode 50 is made from a material such as Ti/Al or Al/Rh, and is formed by filling a penetrating hole provided in the transparent support member 40 which reaches the n-type semiconductor layer 11 with the above-mentioned material. The electrode 50 is in contact with the n-type semiconductor layer 11. The electrode 50 may be formed by layering in order, from the surface of the n-type semiconductor layer 11, ITO, Ti and Al, or PEDOT (poly(3,4)ethylenedioxythiophene), ITO, Ti and Al.

Next, a method of manufacturing the semiconductor light-emitting element 2 having the structure described above is explained referring to FIG. 6A to FIG. 6E. FIG. 6A through FIG. 6E are a series of cross-sectional views showing a plurality of manufacturing processes for the semiconductor light-emitting element 2. The semiconductor layer growth processes, growth substrate separation process, and wet etching process are similar to those described in the first embodiment, and so explanations of these processes are omitted. Hence FIG. 6A through FIG. 6D show the semiconductor layer support process and subsequent processes.

Semiconductor Layer Support Process

Figure 6A:
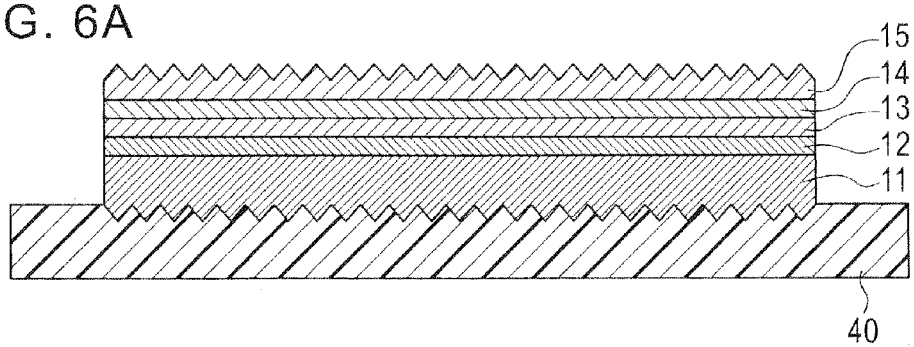
FIGS. 6A, 6B, 6C and 6D are a series of cross-sectional views showing a process to manufacture the semiconductor light-emitting element shown in FIG. 5.

A liquid epoxy resin prior to thermal hardening, which is to form the transparent support member 40, is prepared in a container. Similar to the first embodiment, the wafer, with the growth substrate separated and with hexagonal conical protrusions formed on the surfaces of both the n-type semiconductor layer 11 and the second p-type semiconductor layer 15, is placed on the liquid epoxy resin. At this time, the n-layer side is the lower face, so that the n-type semiconductor layer 11 is immersed in the epoxy resin. Then, by performing heating at approximately 130° C. for 60 minutes, the epoxy resin is hardened to form the transparent support member 40 on the lower face of the n-type semiconductor layer 11. The transparent support member 40 is formed to a thickness of 20 μm or greater in order to secure mechanical strength for the wafer. It should be noted that the transparent support member 40 may initially be formed to be thick, and thereafter the film thickness may be adjusted (reduced) by polishing or grinding. It is preferable that the transparent support member 40 be provided on the side of the n-type semiconductor layer 11 with excellent current dispersion properties. A phosphor may be dispersed in the liquid epoxy resin prior to thermal hardening (FIG. 6A)

Next, ITO paste prior to thermal hardening is applied from above onto the wafer. At this time, the lower-face side (n-layer side) of the wafer is by the transparent support member 40. Thermal hardening treatment is performed at approximately 130° C. for 60 minutes, to form a transparent conductive layer 20 on the second p-type semiconductor layer 15. ITO paste may be applied prior to thermal hardening of the epoxy resin forming the transparent support member 40, but it would cause mixing of the constituent materials of the transparent support member 40 with the transparent conductive layer 20. This is undesirable. Thus, as described above, it is preferable that the ITO paste be applied after the transparent support member 40 has been hardened.

Figure 6B:
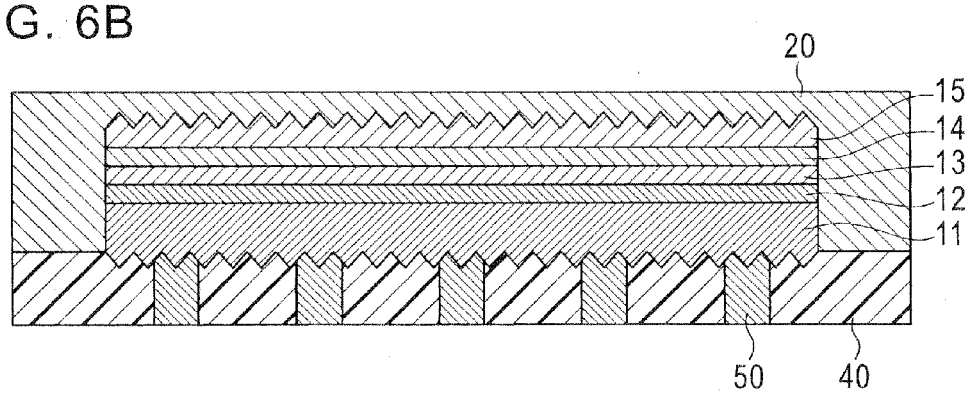

Next, a resist mask having a prescribed mask pattern is provided on the outermost face of the transparent support member 40, and dry etching is performed with this resist mask to provide a penetrating hole, which reaches the n-type semiconductor layer 11, in the transparent support member 40. Next, vacuum deposition is carried out to deposit Ti/Al so as to bury the interior of the penetrating hole formed in the transparent support member 40. This vacuum deposition forms an electrode 50 that connects to the n-type semiconductor layer 11 (FIG. 6B).

Electrode Pad Formation Process

Figure 6C:
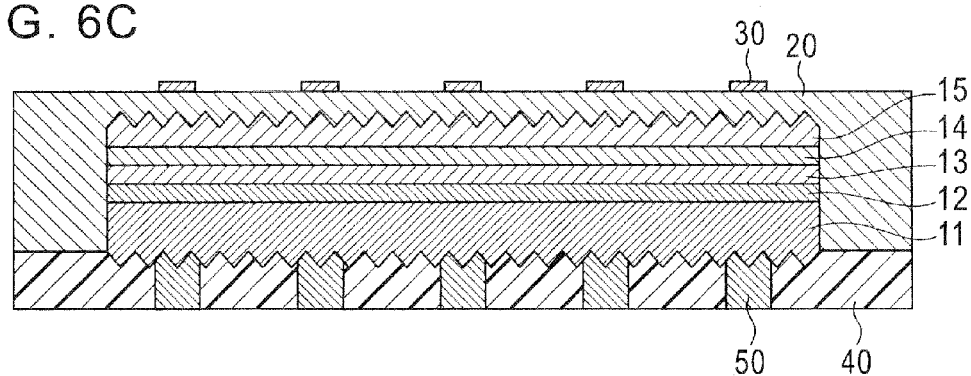

A resist mask is formed having an opening in the portion corresponding to the electrode pad formation region on the transparent conductive layer 20 formed on the p-layer side. Then, vacuum deposition of Au or Ti/Al is performed, the resist is removed, and an electrode pad 30 is formed on the transparent conductive layer 20. Because mechanical strength of the wafer is already secured in the previous semiconductor layer support process, wafer handling properties in this process are improved. It should be noted that the electrode pad 30 may be formed by using screen printing that applies an Ag paste or cream solder to the electrode pad formation region (FIG. 6C).

Chip Separation Process

Figure 6D:
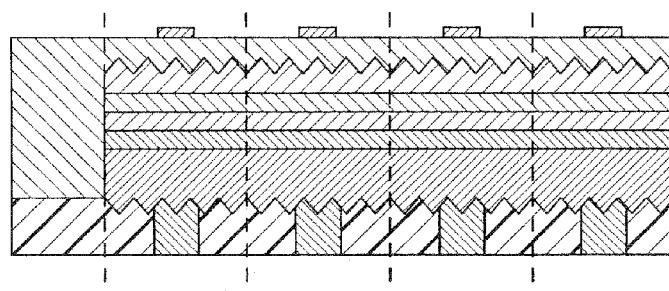
Figure 6E:
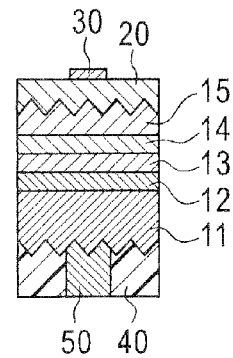
FIG. 6E is a cross-sectional view of one semiconductor light-emitting element obtained upon chip individualization (e.g., dicing)

The method of separating the wafer into chips is similar to that of the first embodiment; separation is performed by a method using a scribing device, by a method using a pulsed laser, or by dicing or similar. Similar to the electrode pad formation process, wafer mechanical strength is secured in the previous semiconductor layer support process, so that wafer handling properties in this process are improved (FIG. 6D). After the above-described processes, the semiconductor light-emitting element 2 of this embodiment is completed (FIG. 6E).

Third Embodiment

Figure 7:
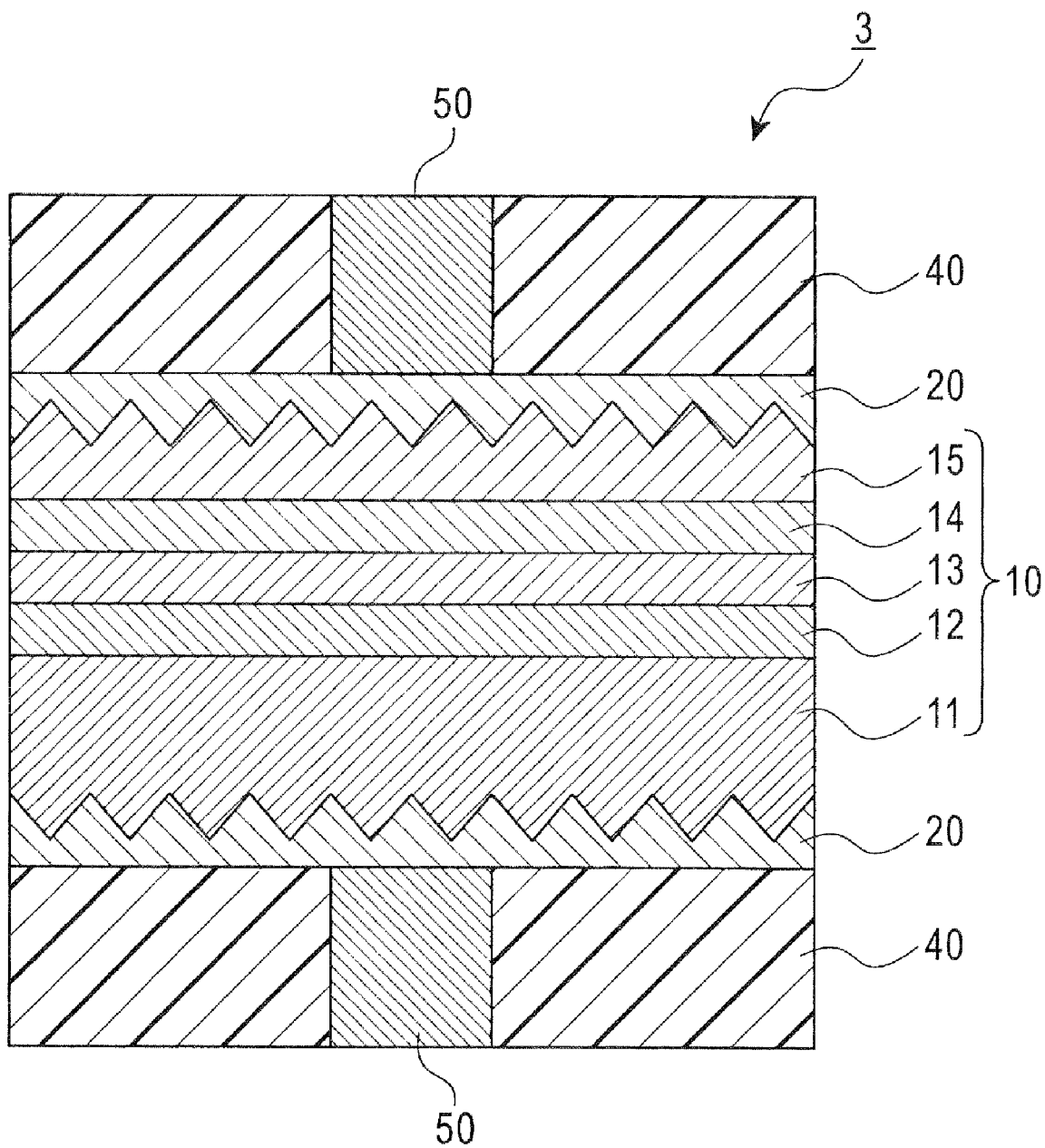
FIG. 7 is a cross-sectional view of another semiconductor light-emitting element according to a third embodiment of the invention.

FIG. 7 is a cross-sectional view of the semiconductor light-emitting element 3 according to a third embodiment of the invention. The structure of the epitaxial layer 10 in the semiconductor light-emitting element 3 of this embodiment is similar to that of the semiconductor light-emitting devices of the first and second embodiments, but the structures of the electrodes and support member in the semiconductor light-emitting element 3 are different from the above-described embodiments. Below, portions differing from the first and second embodiments are explained in detail.

Transparent conductive layers 20 are provided on the outermost faces of the n-type semiconductor layer 11 and the second p-type semiconductor layer 15 of the epitaxial layer 10. In order to prevent reduction of the light extraction efficiency, it is desirable that the thickness of the transparent conductive layers 20 be 1 µm or less. Transparent support members 40 are provided on the outermost faces of the transparent conductive layers 20. The transparent support members 40 are for example made from an epoxy resin, having transparency at the emission wavelength. The transparent support members 40 serve mainly to support the epitaxial layer 10, the mechanical strength of which has been reduced due to separation of the growth substrate. Hence it is preferable that the total thickness of the semiconductor light-emitting element 3, including the transparent support members 40, be 20 µm or greater, in order to secure mechanical strength for the semiconductor light-emitting element 3. In this way, mechanical strength of the semiconductor light-emitting element 3 is secured by the transparent support members 40, so that the thickness of the transparent conductive layers 20 can be reduced compared with the semiconductor light-emitting element 1 of the first embodiment. Accordingly, the light extraction efficiency can be improved. The material of the transparent support members 40 need only have mechanical strength and have transparency at the emission wavelength and modifiability (processibility). Thus, instead of the epoxy resin, it is possible to use a silicone resin, low-melting point glass, polycarbonate resin, or other transparent resin materials for the transparent support members 40. By dispersing YAG or another phosphor within the transparent support members 40, a white light light-emitting element can be obtained. In this embodiment, transparent support members 40 are provided on both the n-layer side and the p-layer side. By mixing these phosphors, therefore, the same emission color can be obtained from both faces of the light-emitting element.

The electrodes 50 are for example made from Ti/Al or Al/Rh. Each electrode 50 penetrates the associated transparent support member 40. Thus, the electrodes 50 make contact with the transparent conductive layers 20 on the n-layer side and on the p-layer side, respectively.

Next, a method of manufacturing the semiconductor light-emitting element 3 having the structure described above is explained referring to FIG. 8A to FIG. 8D. FIG. 8A through FIG. 8D are a series of cross-sectional views of manufacturing processes for the semiconductor light-emitting element 3. The semiconductor layer growth process, growth substrate separation process, and wet etching process are similar to those described in the first embodiment, and so explanations of these processes are omitted. Hence FIG. 8A through FIG. 8D show the semiconductor layer support process and subsequent processes.

Semiconductor Layer Support Process

A transparent support member 40, which has been thermally hardened and with penetrating holes provided in the positions of formation of electrodes 50, is prepared. Then, surface tension and/or the capillary effect is utilized to fill the penetrating holes with electrode material, to form the electrodes 50. It is desirable that this processing be performed either under reduced pressure or in vacuum, in order to promote the capillary effect. Alternatively, electrode material may be evaporation-deposited so as to cover the inner walls of the penetrating holes of the transparent support member 40, and this evaporation-deposited film may be used as a seed layer in electroless plating to fill the penetrating holes with electrode material. When manufacturing a white light light-emitting element, YAG or other phosphors may be dispersed in the transparent support member 40 in advance.

Figure 8A:
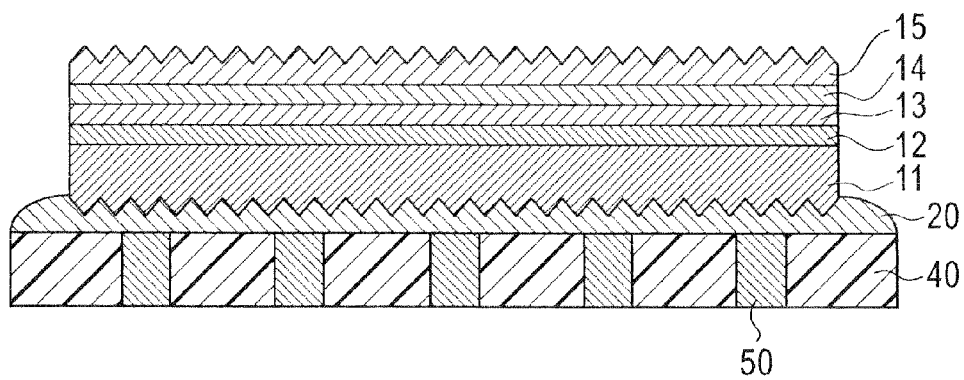
FIGS. 8A, 8B and 8C are a series of cross-sectional views showing a process to manufacture the semiconductor light-emitting element shown in FIG. 7.

Next, ITO paste, which will form a transparent conductive layer 20, is applied onto the transparent support member 40 having the electrodes 50 therein. The transparent support member 40 has already been thermally hardened and has strength, so that a spin-coating method can be used to apply the ITO paste. By using the spin-coating method, the thickness of the transparent conductive layer 20 can easily be controlled, and the ITO paste can be supplied uniformly over the surfaces of the transparent support members 40. Next, the wafer which has been separated from the growth substrate is placed on the transparent support member 40 through processing similar to that of the first embodiment. On the surfaces of both the n-type semiconductor layer 11 and the second p-type semiconductor layer 15 of the wafer, hexagonal conical protrusions have been already formed (FIG. 8A).

Figure 8B:
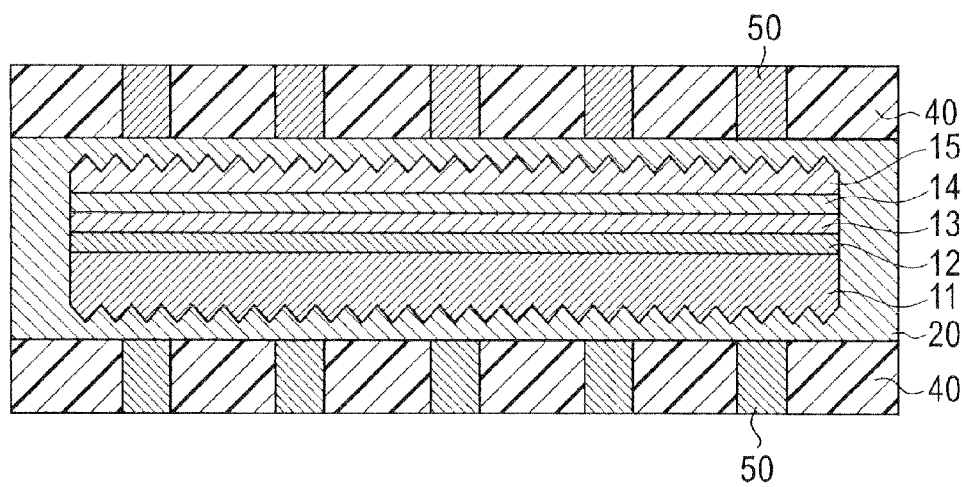

Next, ITO paste is further applied onto the wafer from above, and another transparent support member 40 is placed on the ITO paste. This transparent support member 40 has a similar structure to the member 40 previously mentioned. It has therefore electrodes 50 formed therein. Alternatively, a transparent support member 40 with ITO paste applied in advance may be placed on the wafer. Then, heating is performed at approximately 130° C. for 60 minutes to harden the ITO paste, thereby forming transparent conductive layers 20 connected to the n-layer 11 and to the second p-type semiconductor layer 15. The thickness of the transparent support members 40 is decided such that the total thickness of the semiconductor light-emitting element 3 is 20 μm or greater, in order to secure mechanical strength of the wafer. Alternatively, the transparent support members 40 may initially be formed to be thick, and the film thickness may be adjusted (reduced) later by polishing or grinding (FIG. 8B).

Chip Separation Process

Figure 8C:
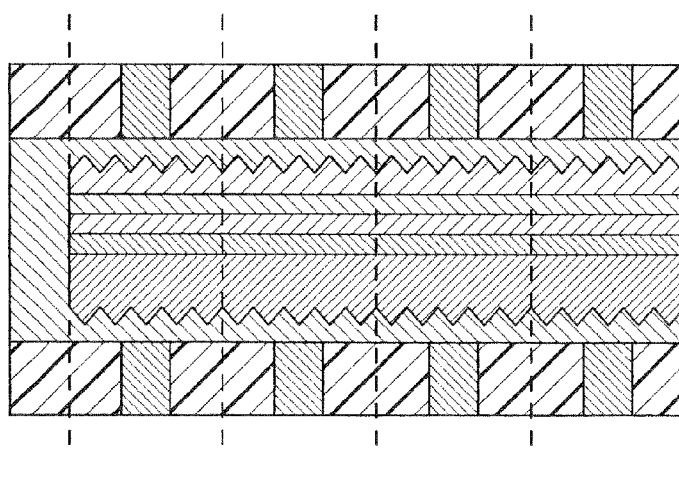
Figure 8D:
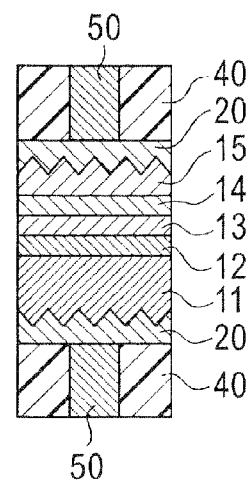
FIG. 8D is a cross-sectional view of one semiconductor light-emitting element obtained upon chip individualization (e.g., dicing)

The method for dividing (separating) the wafer into chips is similar to that of the first embodiment; separation is performed by a method using a scribing device, a method using a pulsed laser, or by dicing or similar. Similar to the electrode pad formation process described above, mechanical strength of the wafer is secured in the previous semiconductor layer support process, so that wafer handling properties in this process are improved (FIG. 8C). After the above processes, the semiconductor light-emitting element 3 of this embodiment is completed (FIG. 8D).

Fourth Embodiment

Figure 9:
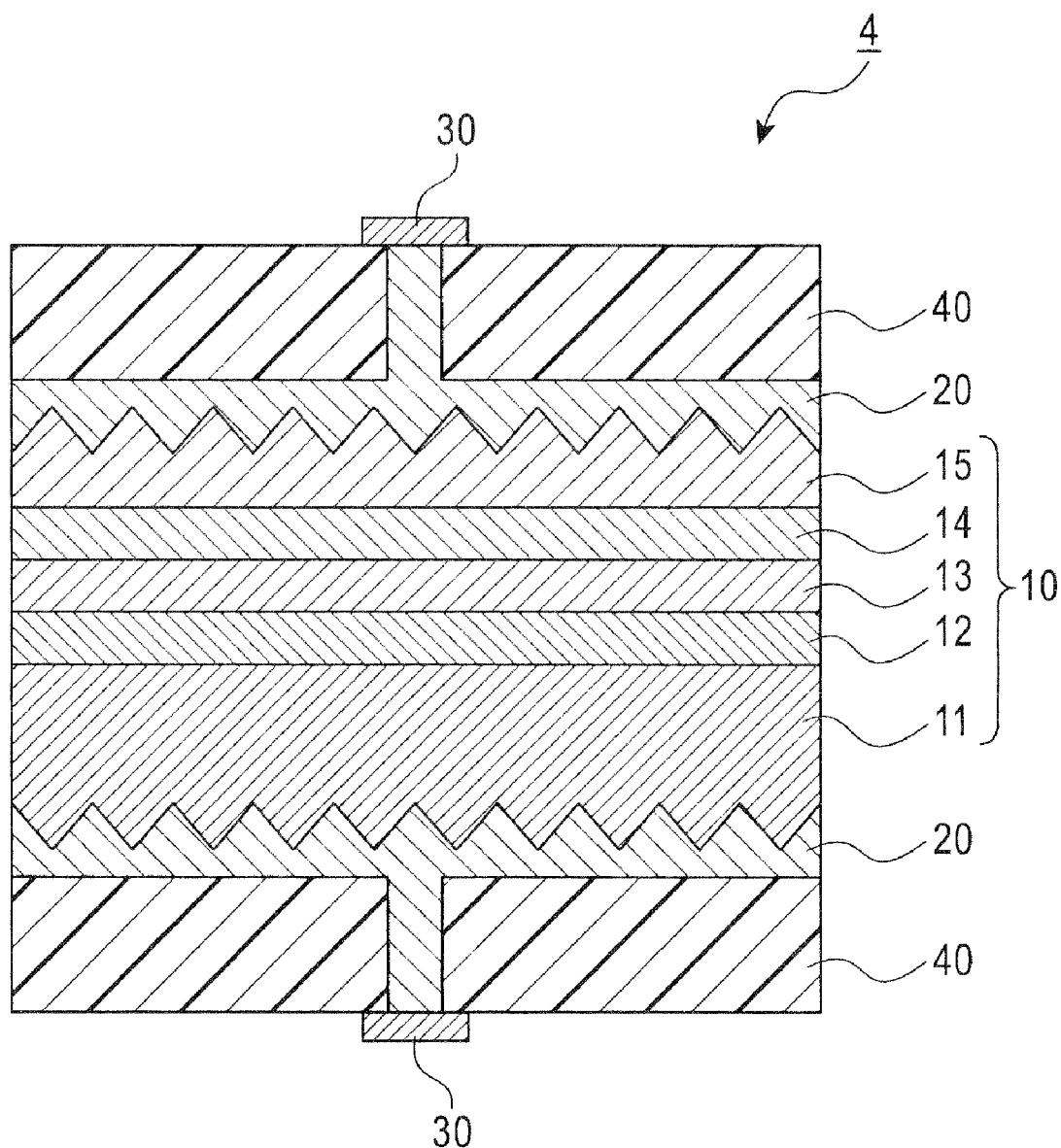
FIG. 9 is a cross-sectional view of another semiconductor light-emitting element according to a fourth embodiment of the invention.

FIG. 9 is a cross-sectional view of the semiconductor light-emitting element 4 of a fourth embodiment of the invention. In the semiconductor light-emitting element 4 of this embodiment, the structure of the epitaxial layer 10 is similar to that of the semiconductor light-emitting devices of the embodiments described above and the structures of the electrodes and support member are similar to those of the third embodiment.

That is, transparent conductive layers 20 are provided on the outermost faces of the n-type semiconductor layer 11 and the second p-type semiconductor layer 15 of the epitaxial layer 10. In order to prevent reduction of the light extraction efficiency, it is desirable that the thickness of each transparent conductive layer 20 be 1 μm or less. On the outermost faces of the transparent conductive layers 20 are provided transparent support members 40. The transparent support members 40 are made from for example an epoxy resin, having transparency at the emission wavelength. The transparent support members 40 serve mainly to support the epitaxial layer 10, the mechanical strength of which has been reduced due to separation of the growth substrate. Hence it is preferable that the total thickness of the semiconductor light-emitting element 4, including the transparent support members 40, be 20 μm or greater, in order to secure mechanical strength for the semiconductor light-emitting element 4. Penetrating holes are provided in the transparent support members 40, and the interiors of the penetrating holes are filled by the transparent conductive layers 20. The material of the transparent support members 40 need only have mechanical strength, transparency at the emission wavelength and modifiability (processibility). Thus, instead of the epoxy resin, a silicone resin, low-melting point glass, polycarbonate resin, or other transparent resin materials can be used. By dispersing YAG or another phosphor within the transparent support members 40, a white light light-emitting element can be obtained. In this embodiment, transparent support members 40 are provided on the faces on both the n-layer side and the p-layer side. Thus, by mixing the transparent support members 40 with phosphors, the same emission color can be obtained from both faces of the light-emitting element.

Next, a method of manufacturing the semiconductor light-emitting element 4 having the structure described above is explained referring to FIG. 10A to FIG. 10E. FIG. 10A through FIG. 10E are a series of cross-sectional views of manufacturing processes for the semiconductor light-emitting element 4. The semiconductor layer growth process, growth substrate separation process, and wet etching process are similar to those described in the first embodiment, and so explanations of these processes are omitted. Hence FIG. 10A through FIG. 10E show the semiconductor layer support process and subsequent processes.

Semiconductor Layer Support Process

Figure 10A:
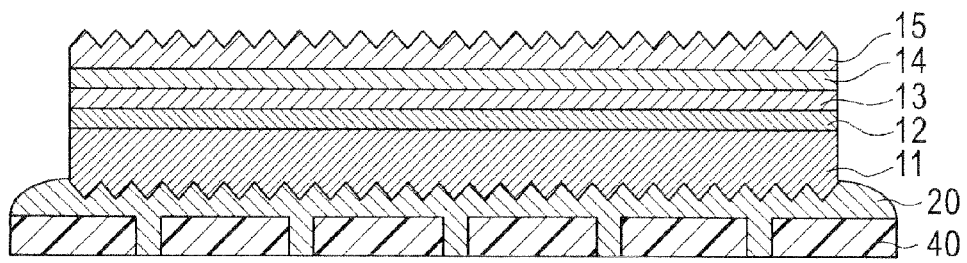
FIGS. 10A, 10B, 10C and 10D are a series of cross-sectional views showing a process to manufacture the semiconductor light-emitting element according to the fourth embodiment of the invention.

A transparent support member 40, which has been thermally hardened and with penetrating holes provided in the positions of formation of electrode pads 30, is prepared. Then, ITO paste which forms a transparent conductive layer 20 is applied onto the transparent support member 40. The transparent support member 40 has already been thermally hardened and has strength, so that a spin-coating method can be used to apply the ITO paste. By using the spin-coating method, the thickness of the transparent conductive layer 20 can easily be controlled, and the ITO paste can be supplied uniformly over the surface of the transparent support member 40. Surface tension and/or the capillary effect are utilized to fill the penetrating holes of the transparent support member 40 with the transparent conductive layer 20. When manufacturing a white light light-emitting element, YAG or other phosphors may be dispersed in the transparent support member 40 in advance. Next, the wafer which has been separated from the growth substrate is placed on the transparent support member 40 through processing similar to that of the first embodiment. The ITO paste is already applied on the transparent support member 40. On the surfaces of both the n-type semiconductor layer 11 and the second p-type semiconductor layer 15 of the wafer, the hexagonal conical protrusions are already formed (FIG. 10A).

Figure 10B:
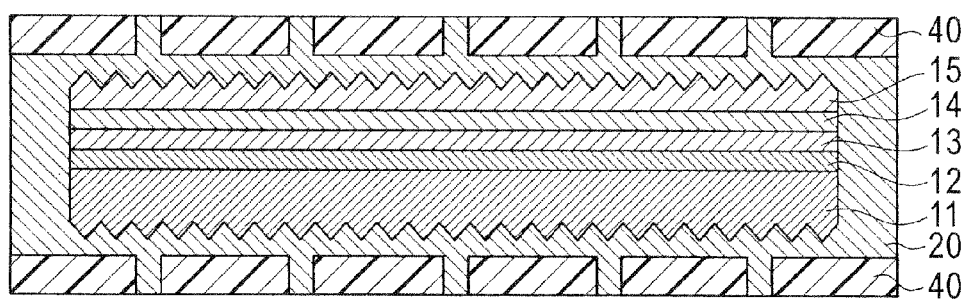

Next, ITO paste is further applied onto the wafer from above, and a transparent support member 40, with structure similar to that used previously with penetrating holes formed, is placed on the ITO paste. Alternatively, transparent support member 40 with ITO paste applied in advance may be placed on the wafer. Then, heating is performed at approximately 130° C. for 60 minutes to harden the ITO paste, thereby forming transparent conductive layers 20 connected to the n-layer 11 and to the second p-type semiconductor layer 15. The thickness of the transparent support members 40 is made such that the total thickness of the semiconductor light-emitting element 4 is 20 μm or greater, in order to secure mechanical strength of the wafer. It should be noted that the transparent support members 40 may initially be formed to be thick, and then the film thickness may be adjusted (reduced) by polishing or grinding (FIG. 10B).

Electrode Pad Formation Process

Figure 10C:
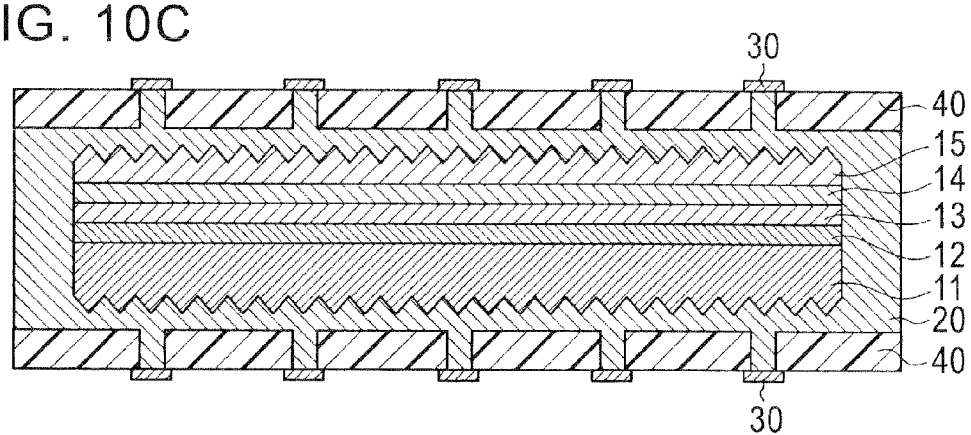

Resist masks, having openings in portions corresponding to the electrode pad formation regions, are formed on the transparent support members 40 provided on the n-layer side and on the p-layer side. After vacuum deposition of for example Au or Ti/Al, the resist is removed to form electrode pads 30 on the transparent support members 40. Because mechanical strength of the wafer is secured in the preceding semiconductor layer support process, wafer handling properties in this process are improved. It should be noted that the electrode pads 30 may be formed by using screen printing to apply an Ag paste or cream solder to the positions of formation of electrode pads (FIG. 10C).

Chip Separation Process

Figure 10D:
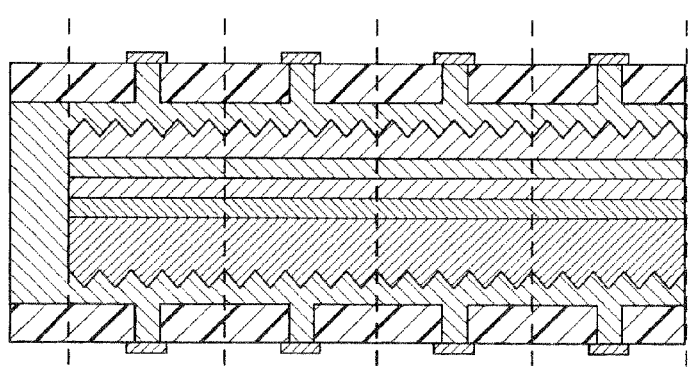
Figure 10E:
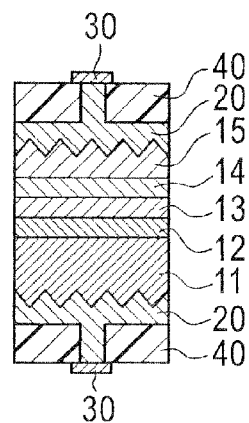
FIG. 10E is a cross-sectional view of one semiconductor light-emitting element obtained upon chip individualization (e.g, dicing)

The method for separation of the wafer into chips is similar to that of the first embodiment; separation is performed by a method using a scribing device, a method using a pulsed laser, or by dicing or similar. Similar to the electrode pad formation process described above, mechanical strength of the wafer is secured in the preceding semiconductor layer support process. Thus, wafer handling properties in this process are improved (FIG. 10D). After the above processes, the semiconductor light-emitting element 4 (FIG. 10E) of this embodiment is completed (FIG. 10E).

Semiconductor Light-Emitting Device

Figure 11A:
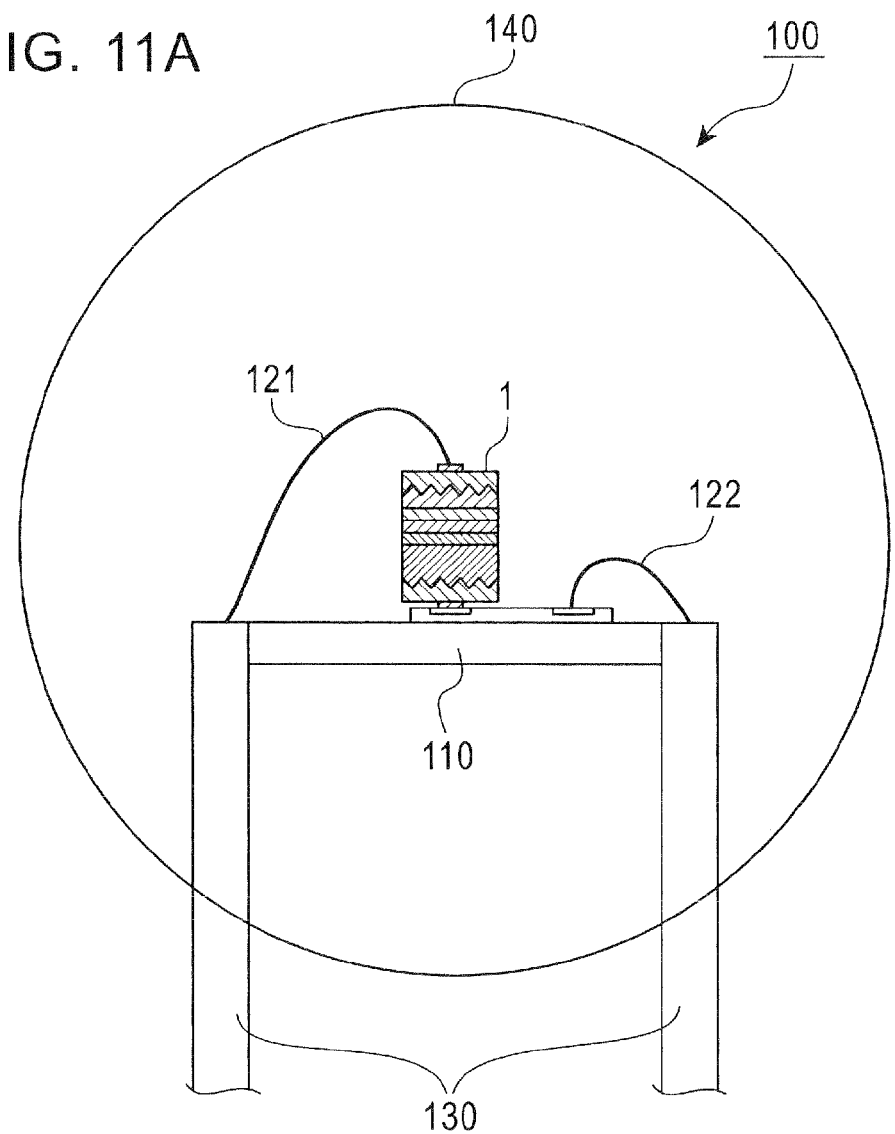
FIG. 11A illustrates a semiconductor light-emitting device equipped with a semiconductor light-emitting element of the invention; and, FIG. 11B is a plan view of a transparent substrate used in a semiconductor light-emitting device shown in FIG. 11A.

Next, FIG. 11A shows the configuration of a semiconductor light-emitting device 100 which incorporates a semiconductor light-emitting element (1 or 2 or 3 or 4) of any of the above-described embodiments. As explained above, a semiconductor light-emitting element of this invention has hexagonal conical protrusions, arising from the wurtzite (hexagonal) crystal structure, formed on the surfaces of the n-type semiconductor layer 11 and the second p-type semiconductor layer 15, and the efficiency of extraction of light from both surfaces of the semiconductor light-emitting element is improved. When applying a semiconductor light-emitting element with this structure to lighting fixtures or equipment, the light extraction efficiency is highest for a package configuration that emits light in all peripheral directions without providing a reflecting member. This is because, if a reflecting member is provided, losses occur at the reflecting face, and light returning into the active layer may be converted into thermal energy. The semiconductor light-emitting device 100 shown in FIG. 11A is an example of a semiconductor light-emitting device which completely eliminates reflecting members by having transparent members only. By emitting light from both faces of the semiconductor light-emitting element 1 (2, 3 or 4) in all peripheral directions, the semiconductor light-emitting device 100 can maximize light extraction efficiency.

Figure 11B:
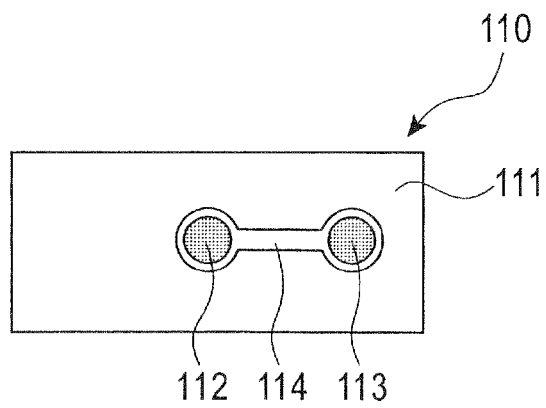

The semiconductor light-emitting element 1 is mounted on a transparent substrate 110. FIG. 11B shows a top view of the transparent substrate 110. On a glass substrate 111 having transparency which forms the transparent substrate 110, are provided a mounting pad 112 and a bonding pad 113. The semiconductor light-emitting element 1 is mounted on the mounting pad 112, and bonding wire is connected to the bonding pad 113. The mounting pad 112 and bonding pad 113 are electrically connected to each other by transparent conductive wiring 114 made from ITO or similar. The mounting pad 112 and bonding pad 113 can be formed by evaporation deposition of Au or similar onto land portions of the transparent conductive wiring 114. In this way, other than the pad portions, the transparent substrate 110 is formed entirely of transparent members. It should be noted that in place of the glass substrate 111, an epoxy resin, silicone resin, or other resin substrate having transparency can be used.

The semiconductor light-emitting element 1 is bonded onto the transparent substrate 110 with conductive paste or bonded onto the mounting pad 112 by soldering. The electrode pad on the side opposite the mounting face of the semiconductor light-emitting element 1 is connected via first bonding wire 121 to one lead terminal 130 (left lead terminal 130 in FIG. 11A). The bonding pad 113 on the transparent substrate 110 is connected to the other lead terminal 130 via second bonding wire 122. The semiconductor light-emitting element 1, transparent substrate 110, and a portion of the lead terminals 130 are buried within transparent sealing resin 140. The resin 140 is for example epoxy resin or silicone resin. Because the semiconductor light-emitting device 100 of this embodiment is configured to emit light in all peripheral directions, it is desirable that the transparent resin 140 be substantially spherical in shape.

By forming the semiconductor light-emitting device entirely of transparent members, light radiated from both faces of the semiconductor light-emitting element can be extracted in all peripheral directions without being reflected. Thus, the configuration of the semiconductor light-emitting device 100 is the most preferred to exploit the performances of the light-emitting element of this invention that has the roughness formed on both uppermost and lowermost faces and the improved light extraction efficiency.

What is claimed is:

1. A method of manufacturing a semiconductor light-emitting element, the semiconductor light-emitting element including: a first semiconductor layer having a first conduction type; a second semiconductor layer having a second conduction type; an active layer provided between said first semiconductor layer and said second semiconductor layer; a polarity inversion layer provided on said second semiconductor layer; and a third semiconductor layer provided on said polarity inversion layer and having said second conduction type, said method comprising:

preparing a growth substrate;

forming a layered structure, by layering in order, on said growth substrate, said first semiconductor layer, said active layer, said second semiconductor layer, said polarity inversion layer, and said third semiconductor layer;

separating said growth substrate from said layered structure, and causing said first semiconductor layer to be exposed;

performing wet etching to said layered structure to form hexagonal conical protrusions arising from a crystal structure, on an outermost surface of said first semiconductor layer and an outermost surface of said third semiconductor layer;

placing said layered structure on liquid transparent resin;

hardening said liquid transparent resin to form a layer of a transparent support member on one of upper and lower faces of said layered structure;

applying a liquid transparent conductive material onto said layered structure; and hardening said liquid transparent conductive material to form a transparent conductive layer on the other of the upper and lower faces of said layered structure.

2. The method of manufacturing the semiconductor light-emitting element according to claim 1, wherein said first semiconductor layer, said active layer, said second semiconductor layer, said polarity inversion layer, and said third semiconductor layer include a wurtzite-structure group III nitride semiconductor, and are layered along a C-axis direction of the crystal structure.

3. The method of manufacturing the semiconductor light-emitting element according to claim 2, wherein said outermost surface of said first semiconductor layer and said outermost surface of said third semiconductor layer have polar faces including nitrogen atoms.

4. The method of manufacturing the semiconductor light-emitting element according to claim 3, wherein said first semiconductor layer, said active layer, said second semiconductor layer, said polarity inversion layer, and said third semiconductor layer include $Al_xIn_yGa_zN$ ($0 \leq x \leq 1$, $0 \leq y \leq 1$, $0 \leq z \leq 1$, $x+y+z=1$).

5. The method of manufacturing the semiconductor light-emitting element according to claim 1, wherein said first semiconductor layer has n type conductivity, and has a thickness of 6 μm or greater.

6. The method of manufacturing the semiconductor light-emitting element according to claim 1, wherein said transparent support member further includes a phosphor.

* * * * *